(12) United States Patent
Sowden et al.

(10) Patent No.: US 7,005,889 B2
(45) Date of Patent: Feb. 28, 2006

(54) LEVEL SHIFTING IN A DATA PROCESSING APPARATUS

(75) Inventors: Andrew John Sowden, Cambridge (GB); Dipesh Ishwerbhai Patel, Saffron Walden (GB); Nicholas Andrew Salter, Cambridge (GB); Harry Edward Oldham, Cambridge (GB)

(73) Assignee: ARM Limited, Cambridge (GB)

( * ) Notice: Subject to any disclaimer, the term of this patent is extended or adjusted under 35 U.S.C. 154(b) by 38 days.

(21) Appl. No.: 10/887,356

(22) Filed: Jul. 9, 2004

(65) Prior Publication Data

US 2005/0077919 A1   Apr. 14, 2005

(30) Foreign Application Priority Data

Oct. 10, 2003   (GB) .................................... 0323804

(51) Int. Cl.
 *H03K 19/0175*   (2006.01)
(52) U.S. Cl. .............................. 326/81; 326/83; 326/38
(58) Field of Classification Search ................... 326/38, 326/62, 68, 80–83, 86
See application file for complete search history.

(56) References Cited

U.S. PATENT DOCUMENTS

| 5,546,016 | A | | 8/1996 | Allen |
| 5,625,280 | A | | 4/1997 | Voldman |
| 6,087,852 | A | * | 7/2000 | Briggs et al. .................. 326/68 |
| 6,351,173 | B1 | | 2/2002 | Ovens et al. |
| 6,369,527 | B1 | | 4/2002 | Morrish |
| 6,674,304 | B1 | * | 1/2004 | Matthews ..................... 326/80 |
| 6,894,537 | B1 | * | 5/2005 | Wert ........................... 326/63 |

\* cited by examiner

*Primary Examiner*—Don Le
(74) *Attorney, Agent, or Firm*—Nixon & Vanderhye P.C.

(57) ABSTRACT

A data processing apparatus and method are provided for controlling level shifting. The data processing apparatus comprises a first component provided within a first voltage domain and operable to receive a first supply voltage, and a second component provided within a second voltage domain and operable to receive a second supply voltage. At least one of the first and second supply voltages are dynamically variable. The data processing apparatus further comprises an interface cell between the first and second voltage domains which is operable to receive a signal issued by the first component in the first voltage domain and destined for the second component. The interface cell comprises level shifting logic operable to convert the signal issued by the first component into a corresponding signal to be propagated to the second component in the second voltage domain. Further, bypass logic is provided which is operable in the event that the first supply voltage and second supply voltage are at the same voltage level to enable a bypass path around the level shifting logic such that the signal issued by the first component is propagated via the bypass path as the corresponding signal to the second component in the second voltage domain.

38 Claims, 6 Drawing Sheets

LEVEL SHIFTING IN A DATA PROCESSING APPARATUS

BACKGROUND OF THE INVENTION

1. Field of the Invention

The present invention relates to a data processing apparatus and method for performing voltage level shifting of a signal as that signal passes from a first voltage domain to a second voltage domain.

2. Description of the Prior Art

When designing a data processing system, consideration has to be given to the power consumed by the data processing system. Whilst it is generally desirable to increase the processing speed of the data processing system, a trade-off will generally need to be made between the speed at which the data processing system is to operate and the power consumed by the data processing system. This is particularly true for data processing systems which are intended to run from battery power rather than mains power, for example mobile phones, Personal Digital Assistants (PDAs), lap-top computers, etc.

More recently, it has been realised that energy consumption, rather than power consumption per se, is very significant in determining battery life. Accordingly, consideration in modern data processing system design is being given not only to enabling the operating frequency to be varied (so that it can be reduced during periods of relative inactivity), but also to allowing the voltage supply to those components to be varied (so as to allow the voltage levels to be reduced during times when the connected component(s) is/are not required to operate as quickly).

The management of voltage levels provided to components in such data processing system designs is often referred to as "dynamic voltage scaling", and typically monitoring functionality is provided within the data processing system to determine for any particular component how fast that component needs to operate. Assuming a decrease in operating speed is determined to be possible, then rather than just reducing the operating speed by itself, it may be possible to also reduce the supply voltage. The reason for this is that if a component is designed to operate at a particular speed, and that operating speed is then reduced, it is often possible to reduce the voltage to the individual elements of the component, without affecting the ability of those elements to operate correctly at that lower speed. A reduction in supply voltage can have a quadractic reduction in energy consumed, and accordingly can significantly enhance battery life.

Although it is hence considered desirable in certain data processing system designs to allow the voltage to particular components to be varied, this leads to the requirement for additional circuitry in the form of level shifting logic in order to convert a signal issued in one voltage domain into a corresponding signal appropriate to another voltage domain, this shift being either an increase in voltage, a decrease in voltage, or indeed no shift (i.e. the signal remains at the same voltage level). Hence, as an example, if one component with a supply voltage of 0.8 volts issues a logic one value to another component with a supply voltage of 1.6 volts, then without any level shifting being performed, there is a possibility that the receiving component may interpret this signal as a logic zero level signal, and accordingly the level shifting logic is required in order to increase the voltage of the issued signal to the 1.6 voltage level appropriate to the receiving component.

SUMMARY OF THE INVENTION

Viewed from a first aspect, the present invention provides a data processing apparatus comprising: a first component provided within a first voltage domain of the data processing apparatus and operable to receive a first supply voltage; a second component provided within a second voltage domain of the data processing apparatus and operable to receive a second supply voltage; at least one of the first and second supply voltages being dynamically variable, and the data processing apparatus further comprising: an interface cell between the first and second voltage domains and operable to receive a signal issued by the first component in the first voltage domain and destined for the second component, the interface cell comprising level shifting logic operable to convert the signal issued by the first component into a corresponding signal to be propagated to the second component in the second voltage domain; and bypass logic operable in the event that the first supply voltage and second supply voltage are at the same voltage level to enable a bypass path around the level shifting logic such that the signal issued by the first component is propagated via the bypass path as the corresponding signal to the second component in the second voltage domain.

The inventors of the present invention have realised that whilst providing dynamic voltage scaling within a data processing system can yield significant benefits with regards to reducing energy consumption, the introduction of the required level shifting logic between any components that might operate at different voltages increases the amount of logic that has to be traversed by signals, and accordingly can have an adverse impact on processing speed.

In order to alleviate this problem, the present invention provides a data processing apparatus in which bypass logic is provided which is operable in the event that the first supply voltage and second supply voltage are at the same voltage level to enable a bypass path around the level shifting logic such that a signal issued by a first component in a first voltage domain can then be propagated via the bypass path as a corresponding signal to a second component in a second voltage domain. This enables the delay that would otherwise be caused by passing the signal through the level shifting logic to be avoided in situations where the first supply voltage and second supply voltage are at the same voltage level.

It will be appreciated that the bypass logic can be controlled in a variety of ways. However, in one embodiment, the bypass logic is operable to receive a bypass signal generated by a controller, the controller being operable to set the bypass signal in the event that the controller determines that the first supply voltage and second supply voltage are at the same voltage level, and the bypass logic being operable to enable the bypass path upon receipt of the set bypass signal unless an override condition exists.

The controller may be provided as part of the data processing apparatus or may be external to the data processing apparatus. In one embodiment, the data processing apparatus takes the form of a processor core, and the controller takes the form of an energy controller provided external to the processor core. In one particular embodiment, the energy controller is provided as part of a System-on-Chip (SoC) within which the processor core is provided.

The bypass logic can be embodied in a variety of ways. However, in one embodiment, the bypass logic comprises multiplexer logic operable to receive as input signals the signal issued by the first component and the corresponding signal produced by the level shifting logic, and to output one of those signals for propagation to the second component in dependence on a control signal derived from the bypass signal. It will be appreciated that the signal issued by the first component may be subjected to some processing prior to it being processed by the level shifting logic, and prior to it being received as one of the inputs of the multiplexer logic. Indeed, in one embodiment, the signal issued by the first component is inverted before it is received by the multiplexer logic, and the inverted form of the signal is also input to the level shifting logic for use in generating the corresponding signal output by the level shifting logic and received by the bypass logic. In that event, the signal output by the bypass logic will be subjected to an inversion before it is propagated to the second component.

One problem that may occur when varying a voltage level in one voltage domain is that whilst the change is taking place, a signal propagated into another voltage domain may be misinterpreted by a component in that other voltage domain.

In order to alleviate this problem, the interface cell of one embodiment of the present invention further comprises clamp logic that is activated, when one or more predetermined conditions exist, to clamp the corresponding signal to a predetermined voltage irrespective of the value of the signal issued by the first component. By taking such an approach, the corresponding signal being issued to the second component in the second voltage domain can be held at a predetermined voltage, and is then unaffected by the signal issued by the first component in the first voltage domain.

It will be appreciated that the one or more predetermined conditions that may cause the clamp logic to be activated can take a variety of forms. In one embodiment, it may be decided that whenever the first supply voltage is being varied, the clamp should be activated so as to avoid any misreading of signals taking place by the second component within the second voltage domain. This might for example be useful in situations where the change in the voltage level of the first supply voltage is not entirely smooth and takes a certain amount of time before it settles at the new voltage level.

In addition to the above described predetermined condition, or as an alternative, one predetermined condition may comprise a condition where the first supply voltage is being turned off, the clamp logic being activated prior to turning off the first supply voltage. Hence, in situations where the first component is being turned off, the clamp logic can be used to ensure that a predetermined voltage is generated at the output from the interface cell, which can, for example, be used to maintain a particular state within the second component. As an example, if an inverter is placed after the output of the interface cell, to invert the output from the interface cell before it is received by the second component, the predetermined voltage may be chosen to be the second supply voltage, so that a logic zero level is then output from the inverter to the second component.

It will be appreciated that the clamp logic can be controlled in a variety of ways. However, in one embodiment, the clamp logic is operable to receive a clamp signal generated by a controller, the controller being operable to set the clamp signal in the event that the controller determines that one of said one or more predetermined conditions exist, and the clamp logic being operable to clamp the corresponding signal to the predetermined voltage. The controller used to generate the clamp signal may be provided as part of the data processing apparatus, or alternatively may be provided externally to the data processing apparatus. In one embodiment of the present invention, the data processing apparatus is a processor core, and the controller takes the form of an energy controller provided externally to the core. In one particular embodiment, the energy controller is provided as part of a SoC within which the processor core is provided.

It will be appreciated that when certain changes to the level of the first supply voltage are being made, there are times when the signal input to the interface cell may become floating. For example, if the first supply voltage is being turned off, then the signal input to the interface cell may become floating. In such a situation, it may become the case that certain elements within the level shifting logic that would not normally be turned on at the same time might in fact both be partially turned on, which would result in DC current being drawn within the level shifting logic. This can lead to energy being dissipated within the level shifting logic even though the level shifting logic is not being actively used.

In accordance with one embodiment of the present invention, this problem is alleviated by arranging the clamp logic to include logic coupled to the level shifting logic which is operable when the clamp logic is activated to isolate the level shifting logic from a reference voltage in order to prevent DC current being drawn within the level shifting logic. The reference voltage may be the second supply voltage, or ground. By isolating the level shifting logic from such a reference voltage, this prevents DC current being drawn within the level shifting logic even if the signal input to the interface cell is floating, and accordingly can avoid the unnecessary drawing of current within the level shifting logic.

In embodiments where the interface cell comprises clamp logic in addition to the level shifting logic, the override condition applicable to the bypass logic may be a condition in which it is determined that the clamp logic is being activated, the presence of the override condition causing the bypass logic not to enable the bypass path irrespective of whether the bypass signal is set.

In such embodiments, the bypass logic may include control logic operable to receive the bypass signal and a clamp signal and to generate a control signal for the bypass logic in dependence on the values of the bypass signal and the clamp signal, such that the control signal will cause the bypass path to be enabled in the event that the bypass signal is set and the clamp signal is not set.

It will be appreciated that different constraints may be placed upon the first supply voltage and the second supply voltage, respectively. In one embodiment, the first supply voltage is lower than or the same as the second supply voltage. One example of such an embodiment is where the first component is a processor operable to perform data processing operations on data values. In such an embodiment, the second component may be a memory device operable to store data values for access by the processor. The memory device may, for example, be a Random Access Memory (RAM) device. Hence, in such an embodiment, the interface cell is used to act upon signals issued by the processor to the memory device. The basic function of the interface cell is to perform any necessary level shifting of signals issued by the processor so that they are at a corresponding level appropriate to the voltage domain being used by the memory device. Further, in certain situations, such as where the supply voltage to the processor is being turned off, the clamp logic employed within the interface cell of certain embodiments of the present invention can be used to clamp the output from the interface cell, so as to ensure that one particular voltage value is output to the memory device.

Further, in the event that the first and second supply voltages are the same, the bypass logic can be used to bypass the level shifting logic, resulting in increased performance.

It will also be appreciated that in an alternative embodiment, such an interface cell may be used to handle signals being issued from the memory device back to the processor. In this embodiment, the memory device is the first component and the processor is the second component. In such situations, the constraint on the supply voltages may be that the first supply voltage (i.e. the supply voltage to the memory device in this instance) is higher than or the same as the second supply voltage (i.e. the voltage provided to the processor).

Further, whilst in the above example, signals passing between a processor and a memory device have been considered, it will be appreciated that the interface cell and bypass logic of the present invention can also be incorporated at interfaces between any other appropriate components within the data processing apparatus.

In one embodiment, the interface is provided within the second voltage domain, and accordingly receives as its supply voltage the second supply voltage. Similarly, in one embodiment, the bypass logic is provided within the second voltage domain, and accordingly receives as its supply voltage the second supply voltage.

In one embodiment of the present invention, the data processing apparatus comprises a plurality of said interface cells and a plurality of said bypass logic, one interface cell and one bypass logic being provided for each signal path between said first component and said second component.

Viewed from a second aspect, the present invention provides a method of controlling level shifting within a data processing apparatus comprising a first component provided within a first voltage domain and operable to receive a first supply voltage, and a second component provided within a second voltage domain and operable to receive a second supply voltage, at least one of the first and second supply voltages being dynamically variable, and the method comprising the steps of: (a) receiving a signal issued by the first component in the first voltage domain and destined for the second component; (b)employing level shifting logic to convert the signal issued by the first component into a corresponding signal to be propagated to the second component in the second voltage domain; and (c) in the event that the first supply voltage and second supply voltage are at the same voltage level, enabling a bypass path around the level shifting logic such that the signal issued by the first component is propagated via the bypass path as the corresponding signal to the second component in the second voltage domain.

In accordance with an alternative aspect of the present invention, the present invention provides a data processing apparatus comprising: a first component provided within a first voltage domain of the data processing apparatus and operable to receive a first supply voltage; a second component provided within a second voltage domain of the data processing apparatus and operable to receive a second supply voltage; at least the first supply voltage being dynamically variable, and the data processing apparatus further comprising: an interface cell between the first and second voltage domains and operable to receive a signal issued by the first component in the first voltage domain and destined for the second component, the interface cell comprising: level shifting logic operable to convert the signal issued by the first component into a corresponding signal to be propagated to the second component in the second voltage domain; and clamp logic that is activated, when one or more predetermined conditions exist, to clamp the corresponding signal to a predetermined voltage irrespective of the value of the signal issued by the first component.

In accordance with this aspect of the present invention, the bypass logic is not employed, but clamp logic is provided as part of the interface cell to enable the corresponding signal issued to the second component in the second voltage domain to be held at a predetermined voltage, such that it is then unaffected by the signal issued by the first component in the first voltage domain. As mentioned earlier, this is useful in situations where a voltage level in the first voltage domain is being varied, since it alleviates the risk that a signal propagated by a component in that first voltage domain may be misinterpreted by a component in the second voltage domain.

Viewed from a fourth aspect, the present invention provides a method of controlling level shifting within a data processing apparatus comprising a first component provided within a first voltage domain and operable to receive a first supply voltage, and a second component provided within a second voltage domain and operable to receive a second supply voltage, at least the first supply voltage being dynamically variable, and the method comprising the steps of: (a) receiving a signal issued by the first component in the first voltage domain and destined for the second component; (b) employing level shifting logic to convert the signal issued by the first component into a corresponding signal to be propagated to the second component in the second voltage domain; and (c) when one or more predetermined conditions exist, clamping the corresponding signal to a predetermined voltage irrespective of the value of the signal issued by the first component.

BRIEF DESCRIPTION OF THE DRAWINGS

The present invention will be described further, by way of example only, with reference to preferred embodiments thereof as illustrated in the accompanying drawings, in which.

DESCRIPTION OF EMBODIMENTS

Figure 1:
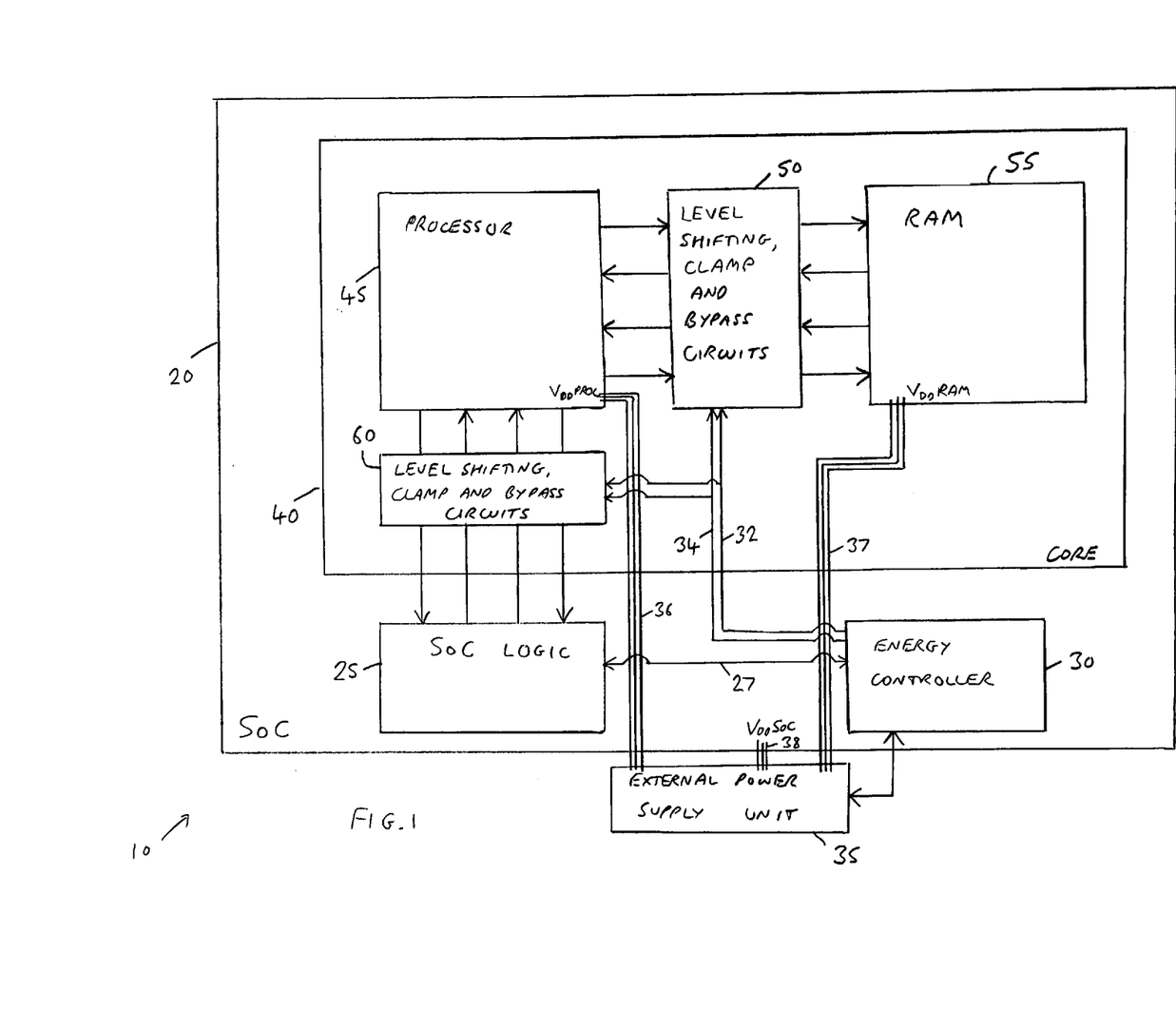
FIG. 1 is a block diagram of a data processing system incorporating a data processing apparatus in accordance with one embodiment of the present invention.

FIG. 1 is a block diagram of a data processing system 10 in which a SoC 20 is provided, which is coupled to an external power supply unit 35 used to provide various components within the SoC with appropriate supply voltages. A data processing apparatus in the form of a processor core 40 is provided within the SoC 20, the core 40 incorporating a processor 45 which is coupled to a RAM 55. The processor 45 is operable to perform data processing operations on data values, and the RAM 55 is operable to store data values for access by the processor.

Within the SoC 20, a number of voltage domains are defined, each voltage domain being provided with its own supply voltage from the external power supply unit 35. Accordingly, as illustrated, it can be seen that the processor 45 has its own associated voltage domain, hereafter referred to as the processor voltage domain, and receives the supply voltage $V_{DD}$PROC over path 36 from the external power supply unit 35. Similarly, the RAM 55 is in a separate voltage domain to the processor, hereafter referred to as the RAM voltage domain, and is operable to receive a supply voltage $V_{DD}$RAM over path 37 from the external power supply unit 35. Finally, the parts of the SoC external to the core 40 are considered to be in a third voltage domain, referred to herein as the SoC voltage domain, with the components in that domain being arranged to receive the supply voltage $V_{DD}$SoC over path 38 from the external power supply unit 35.

Wherever signals cross the boundary between different voltage domains, level shifting, clamp and bypass circuits 50, 60 are provided in accordance with embodiments of the present invention. Hence, considering the interface between the processor 45 and the RAM 55, level shifting, clamp and bypass circuits 50 are provided, these circuits including separate level shifting, clamp and bypass cells for each signal path between the processor 45 and RAM 55. Each such cell can be considered as existing predominantly within the voltage domain of the recipient component for the signal. Accordingly, considering a signal path passing from the processor 45 to the RAM 55, the associated level shifting, clamp and bypass cell can be considered as predominantly existing within the RAM voltage domain. In contrast, for a signal being passed between the RAM 55 and the processor 45, the associated level shifting, clamp and bypass cell can be considered as predominantly existing within the processor voltage domain.

It will be appreciated by those skilled in the art that there will typically be other components provided within the processor core 40 in addition to the processor 45 and the RAM 55. However, for ease of illustration, such components have been omitted from FIG. 1, since they are not relevant to the teaching of embodiments of the present invention.

Similarly, it will be appreciated that the SoC 20 will typically include a number of components external to the core 40, but again for ease of illustration these components have been referred to generically as SoC logic 25, and appropriate level shifting, clamp and bypass circuit 60 will be provided to interface between the processor 45 and the SoC logic 25.

The SoC 20 also includes an energy controller 30, which is operable to determine situations in which the supply voltages for the various voltage domains can be changed, and to issue appropriate control signals to the external power supply unit 35, and to the level shifting, clamp and bypass circuits 50, 60. In addition, communication between the components 45, 55, 25 and the energy controller 30 can take place via SoC logic 25 and over path 27.

With regards to the control of the level shifting, clamp and bypass circuits 50, 60, the energy controller is operable to issue over path 32 a clamp enable signal which when set will cause the clamp logic in the relevant cells to clamp the output signal from those cells to a predetermined value. Further, the energy controller is operable to issue over path 34 a bypass signal which when set will cause the bypass logic within the relevant cells to enable a bypass path around the associated level shifting logic. More details of these functions, and the instances in which they are invoked, will be described later.

Typically, the supply voltages within each voltage domain will be arranged to be dynamically variable under the control of the energy controller 30 within specified ranges. Hence, by way of example only, the supply voltage within the processor voltage domain may be able to be varied between 0.6 and 1.2 volts, the supply voltage in the RAM voltage domain may be arranged to be variable within the range 0.9 to 1.2 volts, whilst the supply voltage within the SoC voltage domain may be fixed at 1.2 volts. Clearly, it will be appreciated that any other suitable ranges can be specified for each voltage domain. In one embodiment of the present invention, it is also envisaged that the supply voltage to the processor domain can be turned off completely in certain situations in order to further reduce energy loss in periods where the processor 45 is not active.

Further, in one particular embodiment of the present invention, whilst both the supply voltage in the processor voltage domain and the supply voltage in the RAM voltage domain may be varied, it is required that the supply voltage in the RAM voltage domain is never less than the supply voltage in the processor voltage domain. Further, in one particular embodiment to be described later with reference to FIG. 4, the supply voltage in the RAM voltage domain is only varied at the same time that the supply voltage is varied in the processor voltage domain. However, it will be appreciated that such constraints may not be required in certain embodiments, and indeed in some embodiments it may be possible to have much more independence in the manner in which the supply voltage in one domain may vary with respect to the supply voltage in another domain.

Figure 2:
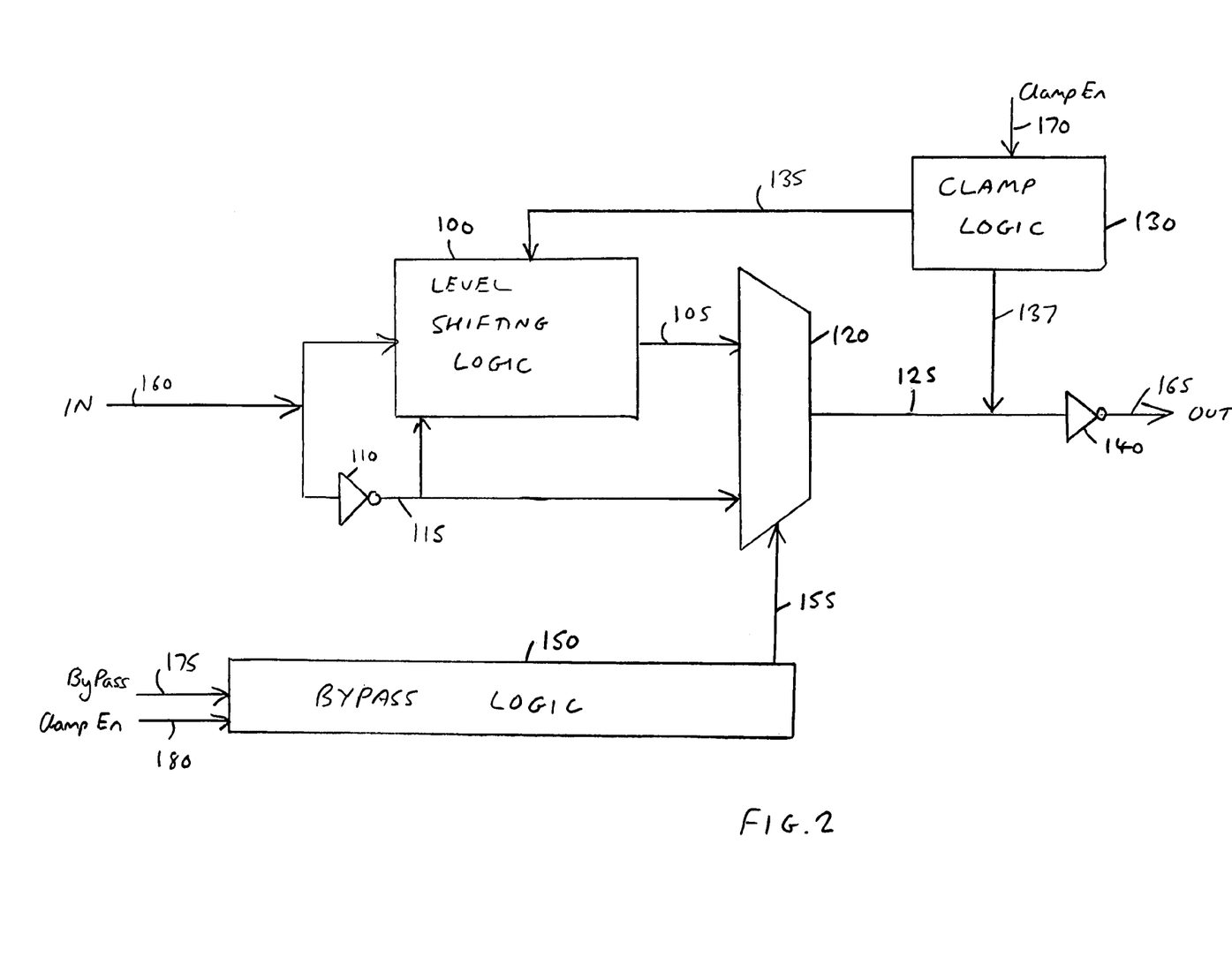
FIG. 2 is a schematic block diagram illustrating in more detail a cell provided within the level shifting, clamp and bypass circuits of FIG. 1.

FIG. 2 is a schematic block diagram of one of the cells provided within the level shifting, clamp and bypass circuits 50, 60. A signal issued to the cell will be received over path 160, where it will be routed to the level shifting logic 100, and also to inverter 110. The output from inverter 110 is then routed via path 115 into the level shifting logic 100, and also to multiplexer 120. The operation of the level shifting logic 100 in accordance with one embodiment of the present invention will be described in more detail later with reference to FIG. 3A, and results in the voltage of the input signal received over path 160 being changed to a voltage level appropriate to the destination voltage domain. Accordingly, as a result of the operations performed by the level shifting logic 100, a signal corresponding to the input signal, voltage shifted as required, is output over path 105 to the multiplexer 120. Due to the manner in which the level shifting logic 100 works in one embodiment of the present invention, the signal output over path 105 will also be inverted with respect to the signal received over path 160.

The multiplexer 120 is controlled by the bypass logic 150, which is arranged to receive over path 175 a bypass signal issued by the energy controller 30 (path 175 is derived from path 34 in FIG. 1). If the bypass signal is set (and the clamp enable signal on path 180 is not set), a control signal will be passed over path 155 to the multiplexer to cause the multiplexer to output over path 125 the signal received from inverter 110 over path 115. The bypass signal will only be set if the energy controller 30 detects that the supply voltage in the source domain (i.e. the domain from which the signal is issued) is at the same voltage level as the supply voltage of the destination domain (i.e. the domain containing the component to which the signal is being sent). In that event, it will be appreciated that the level shifting logic 100 is performing no useful purpose, and accordingly the timing penalty arising as a result of the signal being processed within the level shifting logic 100 can be removed by merely allowing the input signal to bypass the level shifting logic 100 and instead be routed via paths 115 and 125 to the output 165 of the level shifting, clamp and bypass cell.

If the bypass signal is not set, then the control signal passed by the bypass logic 150 over path 155 will cause the multiplexer to output over path 125 the signal from the level signal logic 100 received from path 105.

Whichever input the multiplexer 120 is arranged to output over path 125, the inverter 140 is operable to invert the signal so that it is now in the correct form for outputting to the destination component.

The clamp logic 130 is provided in order to enable the output from the level shifting, clamp and bypass cell to be clamped to a particular voltage level upon the detection of certain conditions by the energy controller 30. In one embodiment of the present invention, the energy controller 30 is arranged to set a clamp enable signal output over path 32 (see FIG. 1) if it is determined that the supply voltage in the processor voltage domain is to be turned off. This signal will be routed over path 170 to clamp logic 130 within every cell connected to a signal path over which the processor 45 can issue signals to, or receive signals from, components in another voltage domain.

Upon receipt of a set clamp enable signal over path 170, the clamp logic 130 will cause the output from the cell to be clamped via path 137 to a predetermined value. For example, the clamp logic could be arranged to clamp the signal on path 125 to a logic one level, such that a logic zero value is then output over path 165 from the cell.

In addition, the clamp logic is operable upon receipt of a set clamp enable signal to issue a signal over path 135 to the level shifting logic 100 which causes the level shifting logic to be isolated from a reference voltage. In one embodiment, this is achieved by arranging the signal 135 to turn off a transistor placed between the level shifting logic 100 and the reference voltage, whether that reference voltage be ground or the supply voltage for the level shifting logic. By taking such an approach, it can be ensured that even if the signal input over path 160 floats, no DC paths can be set up in the level shifting logic 100. Such DC paths would result in the unnecessary flow of current within the level shifting logic, which would have an adverse effect on energy efficiency. Accordingly, the use of the clamp logic not only to clamp the output from the cell but also to prevent DC current being drawn within the level shifting logic 100 can significantly reduce energy consumption in situations where the voltage level in the source voltage domain is being turned off.

As can be seen from FIG. 2, the clamp enable signal is also received over path 180 by the bypass logic 150, and if the clamp enable signal is set, this will cause the bypass logic 150 not to select the bypass path even if the bypass signal received over path 175 is set. It has been found that when clamping the output from the cell in situations where the input signal starts to float, some current can be drained through inverter 110 in situations where the bypass path is enabled. Accordingly, by ensuring that the bypass logic 150 will not select the bypass path in situations where the clamp enable signal is set, this source of unwanted current drain can be removed.

Figure 3A:
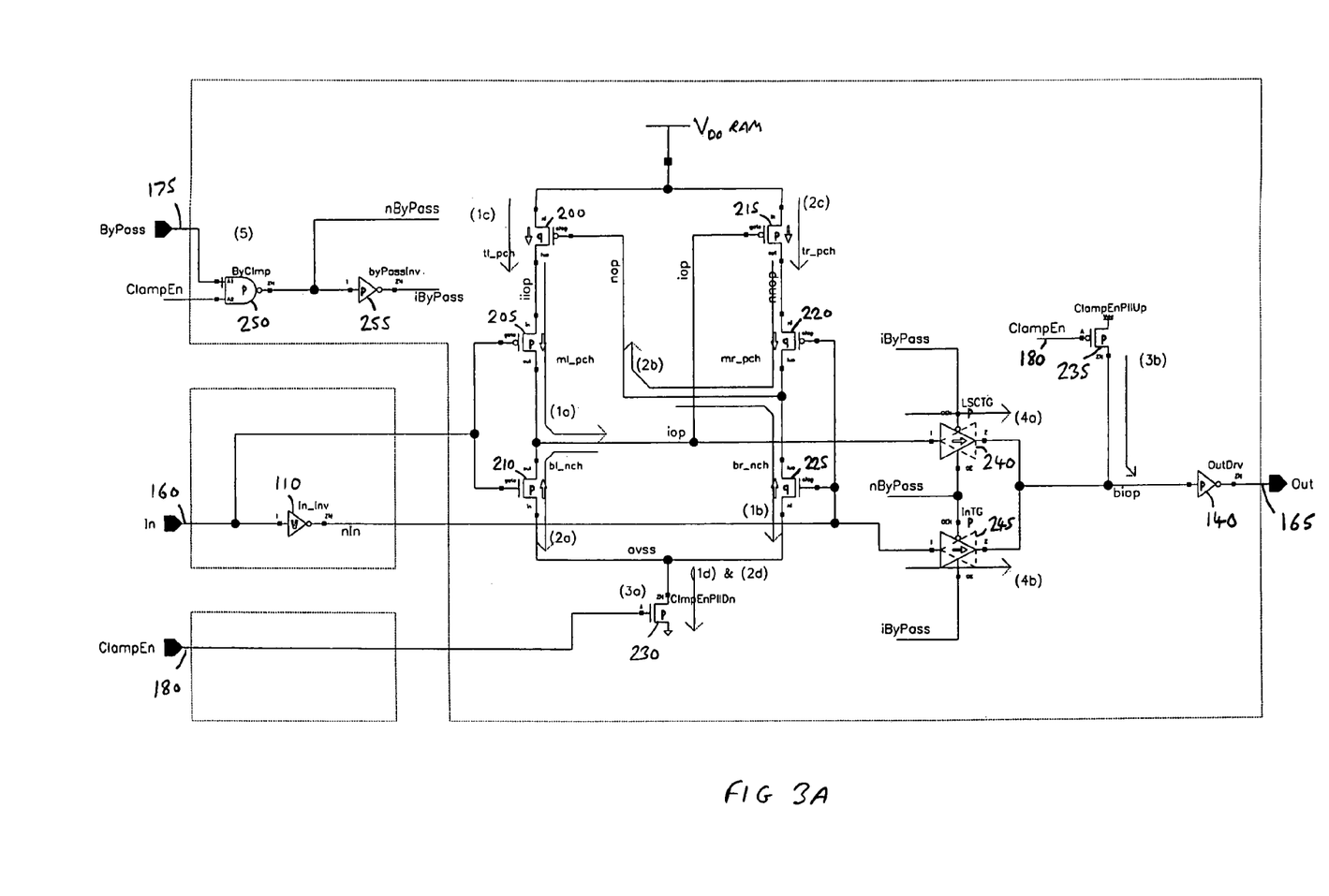
FIG. 3A is a diagram illustrating in more detail the construction of the cell illustrated in FIG. 2.

FIG. 3A illustrates in more detail the construction of the cell of FIG. 2. The level shifting logic 100 consists of transistors 200, 205, 210, 215, 220 and 225. The clamp logic 130 consists of the transistor 235 used to clamp the output from the cell, and the transistor 230 used to isolate the level shifting logic 100 from ground in situations where the clamp enable signal is set. The bypass logic 150 consists of NAND gate 250, inverter 255, and transmission gates 240, 245. In the embodiment illustrated in FIG. 3A, the bypass signal has a logic one level (i.e. a high level) when it is set, whereas the clamp enable signal has a logic zero level (i.e. a low level) when it is set. The operation of the circuit of FIG. 3A will now be described for certain situations.

As a first example, we will consider the situation where the input signal is transitioning from a high level to a low level, the clamp enable signal is high (i.e. not set) and the bypass signal is low (i.e. not set). Firstly, the PMOS device ml_pch 205 opens, and accordingly starts to charge the node iop high (see arrow 1a). However, as node nop will be high and device tl_pch 200 will hence be off, only the charge from node iiop will transfer to the node iop. This is the mechanism which ensures that there is no DC path from the supply voltage $V_{DD}$RAM to ground down the left hand side of the level shifter.

Once node nIn at the output of inverter 110 rises, device br_nch 225 will open and discharge node nop (see arrow 1b). By this time, the input In will be low enough to have closed device bl_nch 210. As node nop falls lower, device tl_pch 200 begins to conduct (see arrow 1c), thereby opening the path from the supply voltage $V_{DD}$ RAM to the node iop and so fully charging node iop to the supply voltage level $V_{DD}$ RAM.

Figure 3B:
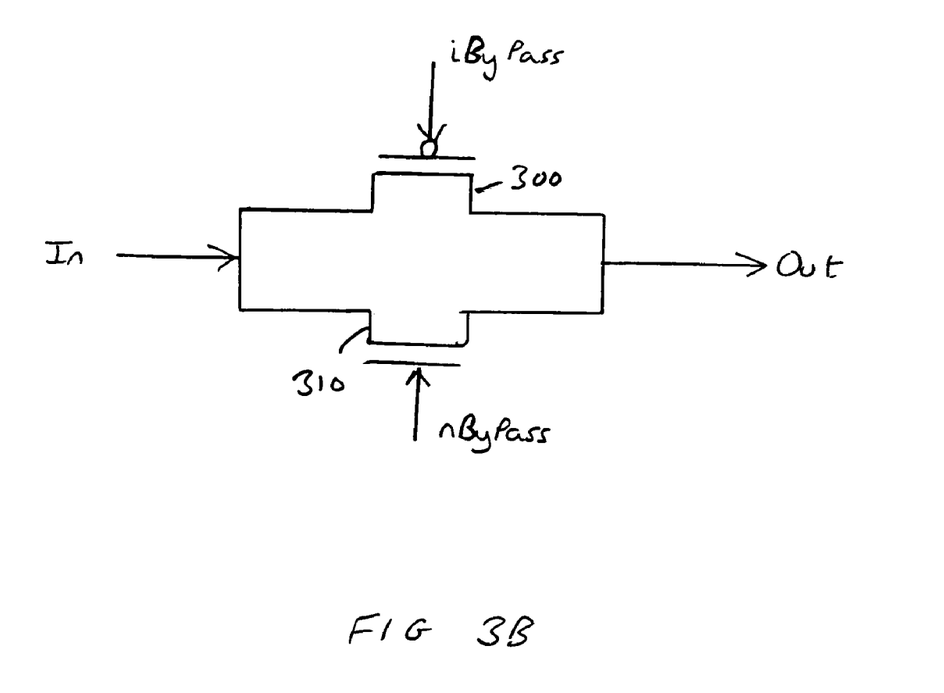
FIG. 3B is a diagram illustrating the construction of a transmission gate within the circuit of FIG. 3A.

Since the clamp enable signal is high and the ByPass enable signal is low (i.e. both signals are not set), the output from NAND gate 250 will be a logic 1 level, and accordingly the signal nByPass will be at a logic 1 level and the signal iByPass will be at a logic zero level. The construction of the transmission gate 240 is illustrated in FIG. 3B. As can be seen from FIG. 3B, since the iByPass signal is at a level zero level and the nByPass signal is at a level 1 level, both the transistors 300 and 310 will turn on and accordingly will connect node iop to the node biop.

The construction of the transmission gate 245 is identical, except its p type transistor receives at its gate the signal nByPass and its n type transistor receives at its gate the signal iByPass. Accordingly, in this instance, the transmission gate 245 will be turned off whilst the transmission gate 240 will be turned on. Accordingly, in summary, the bypass path is not enabled, and instead the output from the level shifting logic will be output to the node biop, whereafter it will be inverted by inverter 140 to produce a logic zero level signal at the output 165.

As a second example, we will consider the situation where the input signal on path 160 is rising to a high level, and again the clamp enable signal is high (i.e. not set) and the ByPass signal is low (i.e. not set). This produces a very similar mechanism to the first example discussed above. Firstly, device ml_pch 205 closes and device bl_nch 210 opens, this starting to discharge the node iop (see arrow 2a). The node iop being high to start with stops the DC path from the supply voltage $V_{DD}$ Ram to ground through the right hand side of the level shifter. This gives the node nIn time to close the device br_nch 225. When node nln falls, device br_nch closes and device mr_pch 220 opens, thereby charging the node nop with the charge that is on the node nnop (see arrow 2b). Once the node iop has fallen low enough, device tr_pch 215 begins to conduct (see arrow 2c), and opens the path from the supply voltage $V_{DD}$ Ram to the node nop, thereby fully charging that node to the supply voltage, thereby ensuring that the node iop remains low.

Again, because the ByPass signal is low and the clamp enable signal is high, the value appearing on the node iop is transferred via transmission gate 240 to the node biop (see arrow 4a), and is then inverted by the inverter 140 to produce a logic 1 output of the appropriate voltage level at the output 165.

As a third example, we will consider a situation where the clamp enable signal is high (not set) and the ByPass signal is also high (i.e. ByPass set). For this example, it does not matter whether the signal at the input 160 is rising or falling. Since both the clamp enable and ByPass signals are high, the output from NAND gate 250 will be a logic zero level, and accordingly the signal nByPass will be low and the signal iByPass will be high. This will cause the transmission gate 245 to turn on (see arrow 4b), whilst the transmission gate 240 will not turn on. As a result, this allows the input signal to bypass the level shifting logic, and pass via inverter 110 to the node biop. This saves the delay associated with the processing within the level shifting logic. The signal received at the node biop is then inverted by inverter 140. As mentioned earlier, the bypass functionality will be turned on in situations where the energy controller 30 determines that the voltage levels in both the source and destination domains are the same.

As a fourth example, we will consider the situation where the clamp enable signal is low (i.e. set). In this example, it does not matter whether the input signal on path 160 is rising or falling, or whether the ByPass signal is set or not. When the clamp enable signal falls low enough, the device ClmpEnPllDn 230 closes, isolating the level shifter from ground. Conversely, the device clampEnPllUp 235 turns on and accordingly charges the node biop high, unless it is already high in which cases it keeps it at that level. Since the device ClmpEnPllDn 230 is off, the supply voltage to the source component, for example the processor, can be completely turned off without any danger of a DC path being formed inside the level shifter stack. This isolation is important because if there was a large amount of coupling to path 160 when the supply voltage for the source component is at zero, then the signal on path 160 might rise to mid-rail, which without the isolation of embodiments of the present invention could cause significant current to be drawn within the level shifter.

It should also be noted that when the clamp enable signal falls low enough, this will ensure that the output from NAND gate 250 is at a logic one level irrespective of the value of the ByPass signal received over path 175. As a result, transmission gate 240 will be turned on and transmission gate 245 will not. This hence prevents any current being drawn through transmission gate 245 and inverter 110, which might adversely affect the operation of the pull up transistor 235 that is aiming to clamp the output signal.

Figure 4:
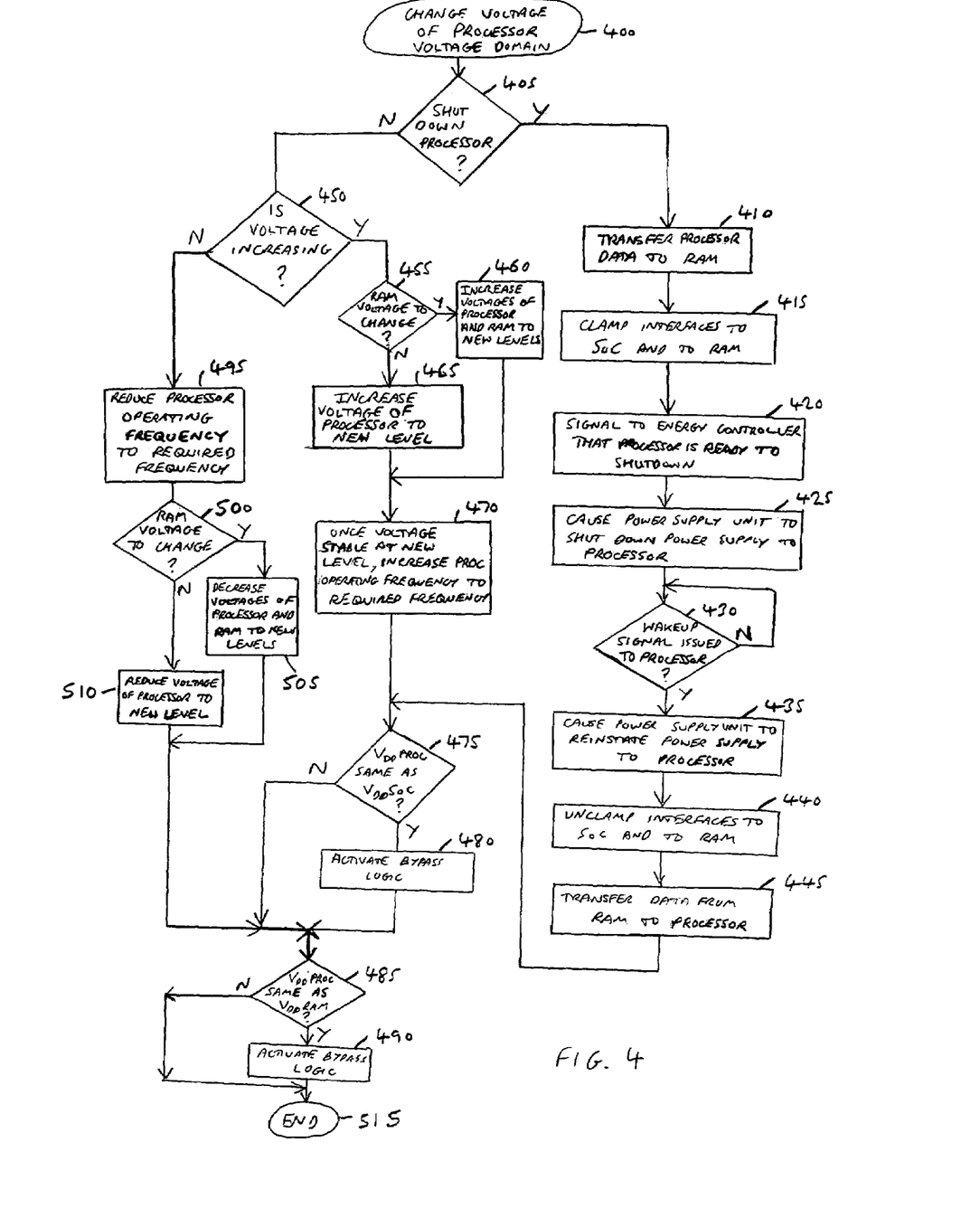
FIG. 4 is a flow diagram illustrating the steps taken in one embodiment of the present invention in order to change the voltage within the processor voltage domain that applies to the processor of FIG. 1.

FIG. 4 is a flow diagram illustrating the operation of the relevant components of the data processing system of FIG. 1 when it is decided to change the voltage of the processor voltage domain (step 400). In this instance, it is determined at step 405 whether the processor is being shut down. Typically, the processor 45 may inform the energy controller 30 via the SoC logic 25 and path 27 when it has no work to do, and the energy controller 30 would then determine whether it is appropriate to shut down the processor 45, in which event it would inform the processor accordingly. If it is decided to shut down the processor at step 405, then the process proceeds to step 410, where the processor 45 transfers its data to the RAM 55, after which at step 415 the interfaces from the processor 45 to the SoC logic 25 and to the RAM 55 are clamped. As discussed earlier, this is achieved by the energy controller 30 setting the clamp enable signal issued over path 32.

Thereafter, the process proceeds to step 420, where a signal is sent to the energy controller to confirm that the processor 425 is ready to shut down. This signal could, for example, be generated by some logic in the SoC voltage domain that detects that the clamps have been asserted and then signals this fact to the energy controller. The process then proceeds to step 425, where the energy controller 30 is arranged to cause the external power supply unit 35 to shut down the power supply $V_{DD}$ PROC supplied to the processor 425.

Thereafter, the process waits at step 430 until a wake up signal is issued to the processor, after which the power supply unit 35 is instructed by the energy controller 30 to reinstate the power supply $V_{DD}$ PROC to the processor 425 at the required voltage level (see step 435). Then, at step 440, the interfaces from the processor 425 to the SoC logic 25 and the RAM 55 are unclamped. Next, at step 445, the data is transferred from the RAM 55 back to the processor 45, after which the process proceeds to step 475.

At step 475, it is determined whether the supply voltage $V_{DD}$ PROC is the same as the supply voltage $V_{DD}$ SoC, and if it is the bypass logic within each cell of the level shifting, clamp and bypass circuits 60 are activated at step 480 in order to enable the respective bypass paths. The process then proceeds to step 485, where a similar determination is made with regards to the supply voltages $V_{DD}$ PROC and $V_{DD}$ RAM. Again, in the event that these voltages are the same, the process proceeds to step 490, where the bypass logic within each cell of the level shifting, clamp and bypass circuits 50 are activated in order to enable the corresponding bypass paths. The process then ends at step 515.

It will be appreciated that whilst the steps 475, 480 and 485, 490 are shown in series, these steps would typically be performed in parallel.

If at step 405, it is determined that the processor is not being shut down, then the process proceeds to step 450, where it is determined whether the voltage level is to be increased or decreased. If the voltage level is increasing, then the process proceeds to step 455, where it is also then determined whether the RAM voltage is to change. In the embodiment considered in FIG. 4, the supply voltage for the RAM voltage domain can only change at the same time that the supply voltage for the processor voltage domain is changing.

If it is determined that the RAM voltage is also changing, then the process proceeds to step 460, where the voltage supplies to both the processor and the RAM are increased to their new levels. It will be appreciated that there is no requirement for the increase to $V_{DD}$ PROC to be the same as the increase to $V_{DD}$ RAM, or for the new voltage levels to be the same. In the event that it is determined at step 455 that the RAM voltage is not changing, then the process proceeds to step 465, where the voltage level of the processor voltage domain is increased to the required new level.

After either step 460 or step 465 have been employed, the process proceeds to step 470, where once the voltage for the processor voltage domain is stable at the new level, and if applicable the voltage for the RAM voltage domain is also stable at its new level, then the processor operating frequency is increased to the required frequency.

After step 470, the process then proceeds through steps 475, 480, 485, 490, as discussed previously, whereafter the process ends at step 515.

If at step 450, it is determined that the voltage is not increasing, then the process proceeds to step 495, where the processor operating frequency is reduced to the required frequency, whereafter it is determined at step 500 whether the voltage supply to the RAM is also to change. If it is determined at step 500 that the voltage supply to the RAM is also to change, then the process proceeds to step 505, where the voltages supplied to both the processor voltage domain and the RAM voltage domain are deceased to the required new levels. Alternatively, if at step 500, it is decided that the voltage supply to the RAM voltage domain is not to change, then the process proceeds to step 510, where only the voltage supply to the processor voltage domain is reduced to the required new level. Irrespective of which of steps 505 or 510 are employed, the process then proceeds thereafter to step 485, where it is determined whether the supply voltage to the processor is now the same as the supply voltage to the RAM. If so, the bypass logic is activated at step 490 before the process ends at step 515, whereas otherwise the process proceeds directly to step 515 where the process ends.

In the example illustrated in FIG. 4, it is assumed that the supply voltage to the SoC is always at the maximum level, and accordingly if the processor supply voltage is being reduced, it can no longer be the same as the supply voltage to the SoC, and accordingly the check of steps 475, 480 need not be performed.

From the above description of an embodiment of the present invention, it will be appreciated that through the use of level shifting, clamp and bypass cells as discussed above, speed benefits can be realised in situations where the voltage levels in a source voltage domain and destination voltage domain are the same. Further, clamping can be employed to ensure that a component in a destination voltage domain does not incorrectly interpret signals being issued from a component in a source voltage domain when the supply voltage of the source component is being changed. More particularly, in one embodiment, the output from the level shifting, clamp and bypass cell can be clamped in situations where the voltage supply to the component in the source voltage domain is being turned off. Further, the particular clamp arrangement of embodiments prevents any DC paths being set up within the level shifter in such situations, which otherwise could consume significant power.

One practical implementation for such an approach is in situations where a processor is to be interfaced with a RAM block, and this RAM block may be provided by a different vendor to the person providing the processor. If the processor is to be subjected to energy management techniques, it may be desired to reduce the voltage of the processor without at the same time reducing the voltage to the RAM block. This can be achieved through the use of the level shifting, clamp and bypass cells as described above. In such embodiments, if the processor is run at a lower voltage compared to the RAM, the level shifting logic will shift the input/output signals to allow the RAM to function at its optimum operating voltage. Further, if it is decided to shut down the processor completely, then the clamp enable signal can be set to cause the inputs/outputs of the RAM to be clamped, thereby retaining the data stored in the RAM. The core voltage can then be lowered to zero without affecting the RAM.

Figure 5:
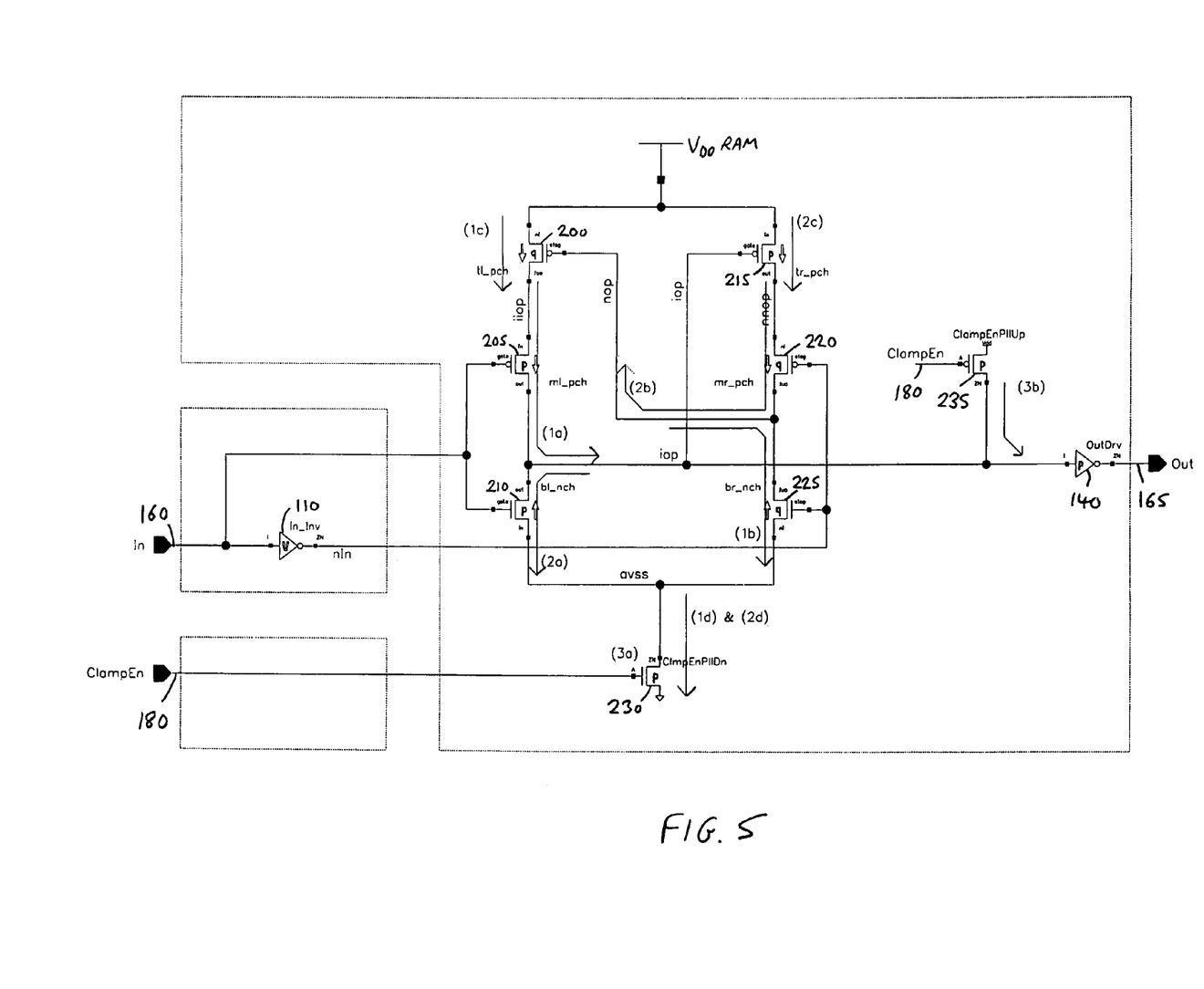
FIG. 5 is a diagram illustrating the construction of a cell that may be used within level shifting and clamp circuits in an alternative embodiment of the present invention where the level shifting, clamp and bypass circuits of FIG. 1 are replaced with level shifting and clamp circuits.

FIG. 5 illustrates an alternative embodiment of the present invention in which the level shifting, clamp and bypass circuits 50, 60 of FIG. 1 are replaced by level shifting and clamp circuits. Each cell within such circuits may take the form illustrated in FIG. 5. As will be apparent from a comparison of FIG. 5 with FIG. 3A, this logic is arranged in a very similar manner to that discussed earlier with reference to FIG. 3A, but with any of the elements forming part of the bypass logic being removed. Accordingly, the earlier provided description of the operation of FIG. 3A also applies to the description of the operation of FIG. 5, with the exception that there is no ByPass signal to be processed, and accordingly logic elements 250, 255, 240 and 245 are omitted. As will be appreciated by those skilled in the art, whilst the logic of FIG. 5 does not enable any speed benefit to be realised through the use of the bypass path in situations where the supply voltage in the source and destination domains are the same, it does allow all of the benefits of the clamp logic to be realised. Accordingly, clamping can be employed to ensure that a component in a destination voltage domain does not incorrectly interpret signals being issued from a component in a source voltage domain when the supply voltage of the source component is being changed. Further, the particular clamp arrangement illustrated in FIG. 5 prevents any DC paths being set up within the level shifter in situations where the voltage supply to the component in the source voltage domain is being turned off.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A data processing apparatus comprising:
    a first component provided within a first voltage domain of the data processing apparatus and operable to receive a first supply voltage;
    a second component provided within a second voltage domain of the data processing apparatus and operable to receive a second supply voltage;
    at least one of the first and second supply voltages being dynamically variable, and the data processing apparatus further comprising:
    an interface cell between the first and second voltage domains and operable to receive a signal issued by the first component in the first voltage domain and destined for the second component, the interface cell comprising level shifting logic operable to convert the signal issued by the first component into a corresponding signal to be propagated to the second component in the second voltage domain; and
    bypass logic operable in the event that the first supply voltage and second supply voltage are at the same voltage level to enable a bypass path around the level shifting logic such that the signal issued by the first component is propagated via the bypass path as the corresponding signal to the second component in the second voltage domain.

2. A data processing apparatus as claimed in claim 1, wherein the bypass logic is operable to receive a bypass signal generated by a controller, the controller being operable to set the bypass signal in the event that the controller determines that the first supply voltage and second supply voltage are at the same voltage level, and the bypass logic being operable to enable the bypass path upon receipt of the set bypass signal unless an override condition exists.

3. A data processing apparatus as claimed in claim 2, wherein the bypass logic comprises multiplexer logic operable to receive as input signals the signal issued by the first component and the corresponding signal produced by the level shifting logic, and to output one of those signals for propagation to the second component in dependence on a control signal derived from the bypass signal.

4. A data processing apparatus as claimed in claim 1, wherein at least the first supply voltage is dynamically variable, and the interface cell further comprises clamp logic that is activated, when one or more predetermined conditions exist, to clamp the corresponding signal to a predetermined voltage irrespective of the value of the signal issued by the first component.

5. A data processing apparatus as claimed in claim 4, wherein said one or more predetermined conditions comprise a condition where the first supply voltage is being turned off, the clamp logic being activated prior to turning off the first supply voltage.

6. A data processing apparatus as claimed in claim 4, wherein the clamp logic is operable to receive a clamp signal generated by a controller, the controller being operable to set the clamp signal in the event that the controller determines that one of said one or more predetermined conditions exist, and the clamp logic being operable to clamp the corresponding signal to the predetermined voltage.

7. A data processing apparatus as claimed in claim 4, wherein the clamp logic includes logic coupled to the level shifting logic which is operable when the clamp logic is activated to isolate the level shifting logic from a reference voltage in order to prevent DC current being drawn within the level shifting logic.

8. A data processing apparatus as claimed in claim 2, wherein at least the first supply voltage is dynamically variable, and the interface cell further comprises clamp logic that is activated, when one or more predetermined conditions exist, to clamp the corresponding signal to a predetermined voltage irrespective of the value of the signal issued by the first component, and wherein the override condition is a condition in which it is determined that the clamp logic is being activated, the presence of the override condition causing the bypass logic not to enable the bypass path irrespective of whether the bypass signal is set.

9. A data processing apparatus as claimed in claim 8, wherein the bypass logic includes control logic operable to receive the bypass signal and a clamp signal and to generate a control signal for the bypass logic in dependence on the values of the bypass signal and the clamp signal, such that the control signal will cause the bypass path to be enabled in the event that the bypass signal is set and the clamp signal is not set.

10. A data processing apparatus as claimed in claim 1, wherein the first supply voltage is lower than or the same as the second supply voltage.

11. A data processing apparatus as claimed in claim 10, wherein the first component is a processor operable to perform data processing operations on data values.

12. A data processing apparatus as claimed in claim 11, wherein the second component is a memory device operable to store data values for access by the processor.

13. A data processing apparatus as claimed in claim 1, wherein the interface cell is provided within the second voltage domain.

14. A data processing apparatus as claimed in claim 1, wherein the bypass logic is provided within the second voltage domain.

15. A data processing apparatus as claimed in claim 1, further comprising a plurality of said interface cells and a plurality of said bypass logic, one said interface cell and one said bypass logic being provided for each signal path between said first component and said second component.

16. A method of controlling level shifting within a data processing apparatus comprising a first component provided within a first voltage domain and operable to receive a first supply voltage, and a second component provided within a second voltage domain and operable to receive a second supply voltage, at least one of the first and second supply voltages being dynamically variable, and the method comprising the steps of:
   (a) receiving a signal issued by the first component in the first voltage domain and destined for the second component;
   (b) employing level shifting logic to convert the signal issued by the first component into a corresponding signal to be propagated to the second component in the second voltage domain; and
   (c) in the event that the first supply voltage and second supply voltage are at the same voltage level, enabling a bypass path around the level shifting logic such that the signal issued by the first component is propagated via the bypass path as the corresponding signal to the second component in the second voltage domain.

17. A method as claimed in claim 16, wherein step (c) is performed upon setting of a bypass signal generated by a controller, the controller being operable to set the bypass signal in the event that the controller determines that the first supply voltage and second supply voltage are at the same voltage level, and at said step (c) the bypass path being enabled upon receipt of the set bypass signal unless an override condition exists.

18. A method as claimed in claim 17, wherein said step (c) further comprises multiplexing between the signal issued by the first component and the corresponding signal produced by the level shifting logic, such that one of those signals is output for propagation to the second component in dependence on a control signal derived from the bypass signal.

19. A method as claimed in claim 16, wherein at least the first supply voltage is dynamically variable, and the method further comprises the step of:
   (d) when one or more predetermined conditions exist, clamping the corresponding signal to a predetermined voltage irrespective of the value of the signal issued by the first component.

20. A method as claimed in claim 19, wherein said one or more predetermined conditions comprise a condition where the first supply voltage is being turned off, said step (d) being performed prior to turning off the first supply voltage.

21. A method as claimed in claim 19, wherein step (d) is performed upon setting of a clamp signal generated by a controller, the controller being operable to set the clamp signal in the event that the controller determines that one of said one or more predetermined conditions exist.

22. A method as claimed in claim 19, wherein said step (d) further comprises the step of:
   isolating the level shifting logic from a reference voltage in order to prevent DC current being drawn within the level shifting logic.

23. A method as claimed in claim 17, wherein at least the first supply voltage is dynamically variable, and the method further comprises the step of:
   (d) when one or more predetermined conditions exist, clamping the corresponding signal to a predetermined voltage irrespective of the value of the signal issued by the first component; and
   wherein the override condition is a condition in which it is determined that step (d) is to be performed, the presence of the override condition causing the bypass path not to be enabled at said step (c) irrespective of whether the bypass signal is set.

24. A method as claimed in claim 23, wherein said step (c) further comprises the step of:

receiving the bypass signal and a clamp signal;

generating a control signal in dependence on the values of the bypass signal and the clamp signal, such that the control signal will cause the bypass path to be enabled in the event that the bypass signal is set and the clamp signal is not set.

25. A method as claimed in claim 16, wherein the first supply voltage is lower than or the same as the second supply voltage.

26. A method as claimed in claim 25, wherein the first component is a processor operable to perform data processing operations on data values.

27. A method as claimed in claim 26, wherein the second component is a memory device operable to store data values for access by the processor.

28. A method as claimed in claim 16, wherein said step (b) is performed within the second voltage domain.

29. A method as claimed in claim 16, wherein said step (c) is performed within the second voltage domain.

30. A method as claimed in claim 16, wherein said steps (b) and (c) are performed independently for each signal path between said first component and said second component.

31. A data processing apparatus comprising:

a first component provided within a first voltage domain of the data processing apparatus and operable to receive a first supply voltage;

a second component provided within a second voltage domain of the data processing apparatus and operable to receive a second supply voltage;

at least the first supply voltage being dynamically variable, and the data processing apparatus further comprising:

an interface cell between the first and second voltage domains and operable to receive a signal issued by the first component in the first voltage domain and destined for the second component, the interface cell comprising:

level shifting logic operable to convert the signal issued by the first component into a corresponding signal to be propagated to the second component in the second voltage domain; and clamp logic that is activated, when one or more predetermined conditions exist, to clamp the corresponding signal to a predetermined voltage irrespective of the value of the signal issued by the first component.

32. A data processing apparatus as claimed in claim 31, wherein said one or more predetermined conditions comprise a condition where the first supply voltage is being turned off, the clamp logic being activated prior to turning off the first supply voltage.

33. A data processing apparatus as claimed in claim 31, wherein the clamp logic is operable to receive a clamp signal generated by a controller, the controller being operable to set the clamp signal in the event that the controller determines that one of said one or more predetermined conditions exist, and the clamp logic being operable to clamp the corresponding signal to the predetermined voltage.

34. A data processing apparatus as claimed in claim 31, wherein the clamp logic includes logic coupled to the level shifting logic which is operable when the clamp logic is activated to isolate the level shifting logic from a reference voltage in order to prevent DC current being drawn within the level shifting logic.

35. A method of controlling level shifting within a data processing apparatus comprising a first component provided within a first voltage domain and operable to receive a first supply voltage, and a second component provided within a second voltage domain and operable to receive a second supply voltage, at least the first supply voltage being dynamically variable, and the method comprising the steps of:

(a) receiving a signal issued by the first component in the first voltage domain and destined for the second component;

(b) employing level shifting logic to convert the signal issued by the first component into a corresponding signal to be propagated to the second component in the second voltage domain; and (c) when one or more predetermined conditions exist, clamping the corresponding signal to a predetermined voltage irrespective of the value of the signal issued by the first component.

36. A method as claimed in claim 35, wherein said one or more predetermined conditions comprise a condition where the first supply voltage is being turned off, said step (c) being performed prior to turning off the first supply voltage.

37. A method as claimed in claim 35, wherein said step (c) is performed upon setting of a clamp signal generated by a controller, the controller being operable to set the clamp signal in the event that the controller determines that one of said one or more predetermined conditions exist.

38. A method as claimed in claim 35, wherein said step (c) further comprises the step of:

isolating the level shifting logic from a reference voltage in order to prevent DC current being drawn within the level shifting logic.

* * * * *